United States Patent
Shuai et al.

(10) Patent No.: US 12,294,343 B2
(45) Date of Patent: May 6, 2025

(54) CAVITY-TYPE FILM BULK ACOUSTIC WAVE RESONATOR WITHOUT A SACRIFICIAL LAYER AND A CONSTRUCTION METHOD THEREOF

(71) Applicant: UNIVERSITY OF ELECTRONIC SCIENCE AND TECHNOLOGY OF CHINA, Sichuan (CN)

(72) Inventors: Yao Shuai, Sichuan (CN); Chuangui Wu, Sichuan (CN); Wenbo Luo, Sichuan (CN)

(73) Assignee: UNIVERSITY OF ELECTRONIC SCIENCE AND TECHNOLOGY OF CHINA, Sichuan (CN)

( * ) Notice: Subject to any disclaimer, the term of this patent is extended or adjusted under 35 U.S.C. 154(b) by 862 days.

(21) Appl. No.: 17/438,885

(22) PCT Filed: Nov. 13, 2019

(86) PCT No.: PCT/CN2019/118090
§ 371 (c)(1),
(2) Date: Sep. 13, 2021

(87) PCT Pub. No.: WO2020/181816
PCT Pub. Date: Sep. 17, 2020

(65) Prior Publication Data
US 2022/0149803 A1 May 12, 2022

(30) Foreign Application Priority Data
Mar. 13, 2019 (CN) .................. 201910187249.0

(51) Int. Cl.
*H03H 3/02* (2006.01)
*H03H 9/02* (2006.01)
*H03H 9/17* (2006.01)

(52) U.S. Cl.
CPC .......... *H03H 3/02* (2013.01); *H03H 9/02015* (2013.01); *H03H 9/173* (2013.01); *H03H 2003/021* (2013.01)

(58) Field of Classification Search
CPC ..... H03H 2003/021; H03H 3/02; H03H 9/173
See application file for complete search history.

(56) References Cited

U.S. PATENT DOCUMENTS

| | | | |
|---|---|---|---|
| 2002/0189062 A1 | 12/2002 | Lin et al. | |
| 2003/0199105 A1* | 10/2003 | Kub | H01L 21/76254 438/48 |
| 2012/0206216 A1* | 8/2012 | Deguet | H03H 3/02 29/25.35 |

FOREIGN PATENT DOCUMENTS

| | | | |
|---|---|---|---|
| CN | 104767500 A | 7/2015 | |
| CN | 107508569 A * | 12/2017 | H03H 3/02 |

(Continued)

OTHER PUBLICATIONS

Bai et al. (2018). Surface modifications of crystal-ion-sliced LiNbO3 thin films by low energy ion irradiations. Applied Surface Science, 434, 669-673.

(Continued)

*Primary Examiner* — Livius R. Cazan
(74) *Attorney, Agent, or Firm* — Caesar Rivise, PC

(57) ABSTRACT

Provided in the present invention are a cavity-type bulk acoustic resonator without the need to prepare a sacrificial layer, and a preparation method therefor, comprising the following steps: taking a piezoelectric single crystal wafer subjected to ion implantation and having a bottom electrode, and forming a cavity on the side of the piezoelectric single crystal wafer having the bottom electrode; then taking a substrate, and bonding the substrate to the side of the piezoelectric single crystal wafer having the cavity; performing heat treatment on the bonded intermediate product (Continued)

to peel off the thin film of the piezoelectric single crystal wafer; and producing a top electrode on the peeled side of the piezoelectric single crystal wafer. The preparation method for the cavity-type bulk acoustic resonator without the need to prepare a sacrificial layer set forth in the present invention does not require the growth of a sacrificial layer, and does not perform etching and hole-forming on the thin film; the mechanical strength of the device is increased, and the thin film is not easily damaged; the cavity structure is formed before film forming, yield is high, and residue from etching is not left after film forming, there being no need to consider the effect of incomplete release on the device.

14 Claims, 4 Drawing Sheets

(56) References Cited

FOREIGN PATENT DOCUMENTS

| | | | |
|---|---|---|---|
| CN | 107809221 | A | 3/2018 |
| CN | 109302159 | A | 2/2019 |
| CN | 109309483 | A | 2/2019 |
| CN | 109981070 | A | 7/2019 |

OTHER PUBLICATIONS

Bai et al. (2020). The thin film bulk acoustic wave resonator based on single-crystalline 43 Y-cut lithium niobate thin films. AIP Advances, 10(7), 075002: 1-5.

Bai et al. (2020). Mo/Ti multilayer Bragg reflector for LiNbO3 film bulk acoustic wave resonators. Journal of Applied Physics, 128(9), 094503: 1-5.

Shuai et al. (2018). Fabrication of Y128- and Y36-cut lithium niobate single-crystalline thin films by crystal-ion-slicing technique. Japanese Journal of Applied Physics, 57(4S), 04FK05: 1-5.

Xing et al. (2020). Lithium niobate single crystal thin film resonator with benzocyclobutene as a reflective layer. Japanese Journal of Applied Physics, 59(1), 016502: 1-6.

Xing et al. (2020). Fabrication of single crystalline LiNbO3 thin films for wideband bulk acoustic wave filters. Materials Express, 10(9), 1504-1510.

English language abstract of CN 109981070 A (2019).

International Search Report from corresponding PCT/CN2019/118090 mailed Jan. 23, 2020.

* cited by examiner

CAVITY-TYPE FILM BULK ACOUSTIC WAVE RESONATOR WITHOUT A SACRIFICIAL LAYER AND A CONSTRUCTION METHOD THEREOF

CROSS-REFERENCE TO RELATED APPLICATIONS

This application is a U.S. National Phase Application of PCT/CN2019/118090, filed Nov. 13, 2019, which claims priority to CN 201910187249.0, filed Mar. 13, 2019, the contents of which applications are incorporated herein by reference in their entireties for all purposes.

FIELD OF THE INVENTION

The invention belongs to the technical field of single crystal film devices, and more specifically to a cavity type film bulk acoustic wave resonator without a sacrificial layer and a construction method thereof.

BACKGROUND OF THE INVENTION

Film Bulk Acoustic Wave Resonator (FBAR) is a single crystal film device. In recent years, with the improvement in processing technology and the rapid development in wireless communication, film bulk acoustic wave resonators, due to the high Q value (greater than 1,000) and the advantages of being compatible with CMOS technology, have been developed rapidly. It converts electrical energy into sound waves through the inverse piezoelectric effect of the piezoelectric film to form resonance. The resonant cavity of a film bulk acoustic resonator is supported by a piezoelectric film. It is a sandwich structure in which a piezoelectric film is laid between two metal electrodes. The resonance frequency is inversely proportional to the thickness of the piezoelectric film, and is also related to the characteristics and thickness of the other layers of the sandwich structure. Both outer sides of the sandwich cavity are filled with air, creating an ideal total reflection state.

At present, the piezoelectric film of an existing film bulk acoustic wave resonator is mainly deposited on the electrode layer, and the quality of the film is highly dependent on the quality of the lower electrode. The problem with this method is that the electrode material does not match the lattice constant of the piezoelectric single crystal wafer, and the electrode surface is not flat, which can cause the piezoelectric single crystal film to form polycrystals; the film growth quality is poor and the crystal axis orientation is difficult to control. These problems will greatly affect the performance of FBAR devices.

To obtain a high-quality piezoelectric film, a method of wafer bonding transfer is used in the prior art to prepare the piezoelectric film. With this method, single crystal wafer materials or wafer materials with high-quality epitaxial piezoelectric layers are selected as piezoelectric single crystal wafers, with high-energy ion implanted, and then the wafer bonding process adopted on the target substrate for transfer and construction of high-quality piezoelectric films. The micro-machining method of the cavity-type thin-film bulk acoustic resonator requires etching and opening holes from the surface of the film material to corrode the silicon material under the piezoelectric film. Although a better reflection effect can be obtained, this method needs to be adopted in such a way that the silicon material is prepared under the piezoelectric film in advance as a sacrificial layer, and in the process of etching the silicon material under the piezoelectric film from the surface of the film material with openings, it is easy to damage the film and reduce the quality of the film. In addition, corrosion residues formed in the cavity can affect device performance. Therefore, the method for constructing a cavity-type bulk acoustic resonator without making a sacrificial layer still needs to be improved.

SUMMARY OF THE INVENTION

The invention provides a cavity type film bulk acoustic wave resonator without a sacrificial layer and a construction method thereof, aiming to solve the problems of poor film quality and the formation of corrosive residues in cavity when constructing a cavity-type film bulk acoustic wave resonator using prior art.

To solve the above problems, the invention provides a method for constructing a cavity-type film bulk acoustic wave resonator without making a sacrificial layer, comprising the following steps:

step 1: using an ion-implanted piezoelectric single crystal wafer with a bottom electrode and forming a cavity on the bottom electrode side of the piezoelectric single crystal wafer; taking a substrate and bonding the substrate to the cavity side of the piezoelectric single crystal wafer;

step 2: performing heat treatment on the bonded intermediate formed in step 1 to peel off the film from the piezoelectric single crystal wafer and generating top electrode at the film-peeling side. Preferably, in step 1, the substrate is bonded to the cavity side of the piezoelectric single crystal wafer in the following procedures:

Apply bonding compound to one side of the substrate and bonding the substrate to the cavity side of the piezoelectric single crystal wafer; wherein, the bonding compound is a type of organic insulating material; the organic insulating material is at least one or more of benzocyclobutene, polyimide, silsesquioxane and rotating coated glass; preferably, the applied bonding compound is 100 nm-4,000 nm in thickness;

alternatively, growing bonding compound to one side of the substrate and bonding the substrate to the cavity side of the piezoelectric single crystal wafer; wherein, the bonding compound is at least one or more of silicon oxide, silicon nitride, aluminum oxide and aluminum nitride; preferably, the growing bonding compound is 100 nm-4,000 nm in thickness.

Preferably, the piezoelectric single crystal wafer is one of quartz, lithium niobate, lithium tantalate, aluminum nitride, zinc oxide, barium titanate, potassium dihydrogen phosphate and lead magnesium niobate-lead titanate;

wherein, the lithium niobate is $LiNbO_3$, LN in short; the lithium tantalate is $LiTaO_3$, LT in short; the aluminum nitride is AlN; the zinc oxide is ZnO; the barium titanate is $BaTiO_3$, BTO in short; the potassium dihydrogen phosphate is $KH_2PO_4$; the lead magnesium niobate-lead titanate is $(1-x)[Pb(Mg_{1/3}Nb_{2/3})O_3]-x[PbTiO_3]$, PMN-PT in short;

an ion-implanted piezoelectric single crystal wafer with a bottom electrode is formed according to the following method: taking a piezoelectric single crystal wafer, implanting ions onto the piezoelectric single crystal wafer and growing bottom electrode on the implanted face to form an ion-implanted piezoelectric single crystal wafer with a bottom electrode.

Preferably, the ions implanted into the piezoelectric single crystal wafer are at least one of hydrions (preferably positive monovalent hydrogen ions, H+), helium ions (preferably positive monovalent helium ions, He+), and boron ions (preferably positive boron ions, B+) or arsenic ions (preferably positive monovalent arsenic ions, As+); the energy for ions implantation is 100 KeV-1,000 KeV; the implantation dose is $2-8\times10^{16}/cm^2$; the ion beam current is 0.1-10 $\mu m/cm^{-2}$; the implantation depth is 0.3-8 μm.

Further preferably, the piezoelectric single crystal wafer is lithium tantalate, and the ions implanted into the piezoelectric single crystal wafer are H ions; the energy of the implanted ions is 150 KeV-1,000 KeV; and the implantation depth is 1.5-8 μm.

Alternatively, the piezoelectric single crystal wafer is lithium tantalate, and the ions implanted into the piezoelectric single crystal wafer are As ions; the energy of the implanted ions is 150 KeV-1,000 KeV; and the implantation depth is 0.5-1.8 μm.

Alternatively, the piezoelectric single crystal wafer is lithium niobate, and the ions implanted into the piezoelectric single crystal wafer are He ions; the energy of the implanted ions is 150 KeV-1,000 KeV; and the implantation depth is 0.6-2.2 μm.

Alternatively, the piezoelectric single crystal wafer is lithium niobate, and the ions implanted into the piezoelectric single crystal wafer are B ions; the energy of the implanted ions is 150 KeV-1,000 KeV; and the implantation depth is 0.3-1 μm.

Preferably, the bottom electrode of the piezoelectric single crystal wafer is grown by the following method: first lithographically forming the pattern to be grown on the surface of the piezoelectric single crystal wafer, then growing the electrode, and finally washing off the excess part; alternatively, first, growing electrode on the surface of the piezoelectric single crystal wafer, then preparing a mask, and finally etching away the excess part;

the electrode material of the growing bottom electrode is one of Al, Au, Mo, Pt, and W; the thickness of the bottom electrode is 50-500 nm;

the growth methods of the bottom electrode include one of magnetron sputtering, resistive evaporation, and electron beam deposition;

preferably, the material of the substrate is one or more of silicon, silicon on an insulating layer, glass, quartz, lithium niobate, lithium tantalate, silicon carbide, gallium nitride, and gallium arsenide.

In step 1, forming a cavity on the side of the piezoelectric single crystal wafer with the bottom electrode specifically includes the following steps: growing a supporting layer on the side of the piezoelectric single crystal wafer with the bottom electrode, a cavity is formed on the grown film; preferably, the cavity depth of the cavity is greater than 100 nm.

Forming a cavity on one side of the piezoelectric single crystal wafer having a bottom electrode specifically includes the following steps: taking the piezoelectric single crystal wafer, growing a supporting layer on the side of the piezoelectric single crystal wafer with the bottom electrode, and then performing pattern etching on the side of the growing supporting layer to form a cavity; the supporting layer is one or more of silicon oxide, silicon nitride, amorphous silicon, and metal;

the metal includes, but not limited to, Al, Mo, Pt, Au, Cr, Ag, Cu and their alloys.

Preferably, an electrode protection layer is also grown between the supporting layer and the bottom electrode; the electrode protection layer includes one or more of silicon oxide, silicon nitride, amorphous silicon, aluminum oxide, and aluminum nitride;

preferably, dry etching or wet etching is adopted for the etching of the growing supporting layer;

preferably, the wet etching is specifically: etching with an etchant at a temperature of 40-90° C. for 5-30 minutes; the etchant is one or more of KOH solution and TMAH solution;

preferably, in step 1, the bonding compound is applied by spin coating to form a bonding layer; the spin coating includes a low rotation speed stage and a high rotation speed stage; the rotation speed of the low rotation speed stage is 200 rpm/s-800 rpm/s, the rotation time is 10 s-30 s; the rotation speed of the high rotation speed stage is 1,000 rpm/s-8,000 rpm/s, and the rotation time is 15 s-60 s;

preferably, the step of pre-baking the piezoelectric single crystal wafer spin-coated with the bonding compound is included; the pre-baking temperature is 50-120° C., and the pre-baking time is 60-600 s;

preferably, in step 1, the substrate is pre-bonded with the cavity side of the piezoelectric single crystal wafer, and then the bonding is performed; preferably, the pre-bonding pressure is $1\times10^5$ pa-$5\times10^6$ pa, and the pressure holding time is 3-30 min; after pre-bonding, slowly increase the temperature to 150-500° C., and keep the temperature at 150-500° C. to make the organic polymer layer completely cured and the bonding is completed.

Preferably, in step 2, the film of the bonded intermediate formed in step 1 is peeled off at a temperature of 180-400° C., and then annealed at a temperature of 180-400° C. for 10 to 600 minutes to obtain an off-peeled film; preferably, the thickness of the piezoelectric single crystal wafer with the film peeled off is 500-1,000 nm.

Preferably, the electrode material of the growing top electrode is one of Al, Au, Mo, Pt, and W; the thickness of the top electrode is 50-300 nm; the growth methods of the top electrode include magnetron sputtering, resistive evaporation, and electron beam deposition.

The cavity type film bulk acoustic wave resonator provided by the invention without making a sacrificial layer is prepared by the method for constructing a cavity type film bulk acoustic resonator without making a sacrificial layer.

Preferably, the cavity type film bulk acoustic resonator without making a sacrificial layer comprises a top electrode, a piezoelectric film, a bottom electrode, a supporting layer, a bonding layer and a substrate, and the supporting layer is provided with a cavity; preferably, the bonding layer has a thickness of 2-6 μm.

Compared with the prior art, the advantages and beneficial effects of the invention are:

1. The method for constructing a cavity-type film bulk acoustic resonator without making a sacrificial layer according to the invention, a piezoelectric single crystal wafer is made into a cavity before bonding, and the cavity is made on the implantation side without the need to grow the sacrificial layer in advance; then punch the piezoelectric film layer or the lower electrode or the upper electrode to release the sacrificial layer, which greatly reduces the complexity of the process, and does not etch and form a hole in the film: the mechanical strength of the device is improved, it is not easy to damage the film and does not affect the quality of the film; the cavity structure is formed before the film is formed, the yield is high, and there is no residue left from etching after the film is formed, and there is no need to consider the impact of incomplete release on the device, with the Q value of the resonator greatly improved and the resonator clutter reduced. A high-quality single crystal oxide film can be grown on a polycrystalline metal bottom electrode, and a single crystal film device can be constructed with the film peeling method. The invention can include a silicon substrate with any crystal orientation, or any other commonly used substrate.

2. The method for constructing a cavity type film bulk acoustic resonator without making a sacrificial layer described in the invention is to grow a film on the bottom electrode side of the piezoelectric single crystal wafer and etch on the grown film to forming a shallow cavity. Compared with the reverse-side etching the substrate, the etching depth is greatly reduced, and the etching time is shortened.

3. The method for constructing a cavity type film bulk acoustic resonator without making a sacrificial layer described in the present invention uses an organic polymer as the bonding compound for bonding. On the one hand, it can play a bonding role, and the organic polymer, as the bonding compound, can overcome the problem of uneven bonding surface during bonding, and on the other hand, it can provide support for the film layer.

In drawings, 1—Substrate; 2—Cavity; 3—Bonding layer; 4—Piezoelectric single crystal wafer; 5—Ion damage layer; 6—Implantation face; 7—Bottom electrode; 8—Supporting layer; 9—Top electrode.

DETAILED DESCRIPTION OF THE PREFERRED EMBODIMENTS

In the following paragraphs, the technical schemes presented in the embodiments of the invention are described in a clear and complete manner on the basis of the drawings attached to the embodiments of the invention. Obviously, the described embodiments are a part, not the whole, of the embodiments of the invention. Based on the embodiments of the invention, all other embodiments obtained by the ordinary skilled in the art without contributing creative work are fall within the scope of protection of the invention.

It shall be noted that for the embodiments of the invention with no specific conditions specified, the conventional conditions or the conditions recommended by the manufacturer shall be followed. With no manufacturers specified, the reagents or instruments used are conventional products available in the market. The raw materials produced by different manufacturers or of different types have no impact on the implementation of the technical effects and the realization of the technical schemes related to the invention.

Embodiment 1

Figure 1:
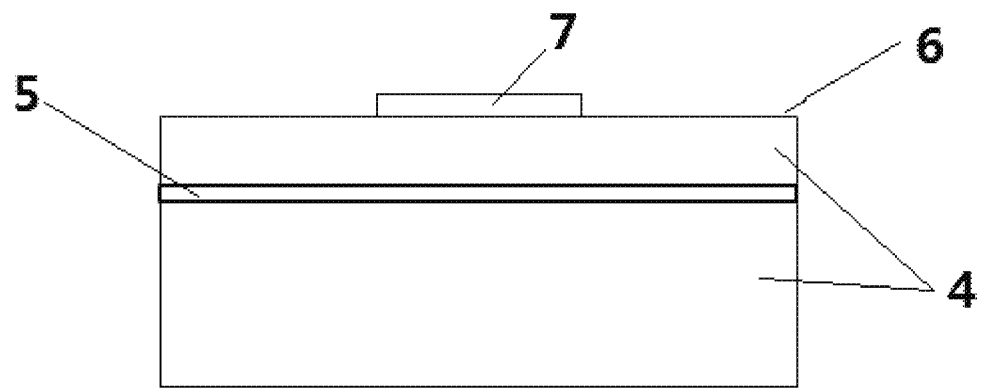
FIG. 1 is a structure diagram of an ion-implanted piezoelectric single crystal wafer with a bottom electrode obtained in step (a) of the method for constructing a cavity type film bulk acoustic wave resonator without making a sacrificial layer in embodiment 1 of the invention.
Figure 2:
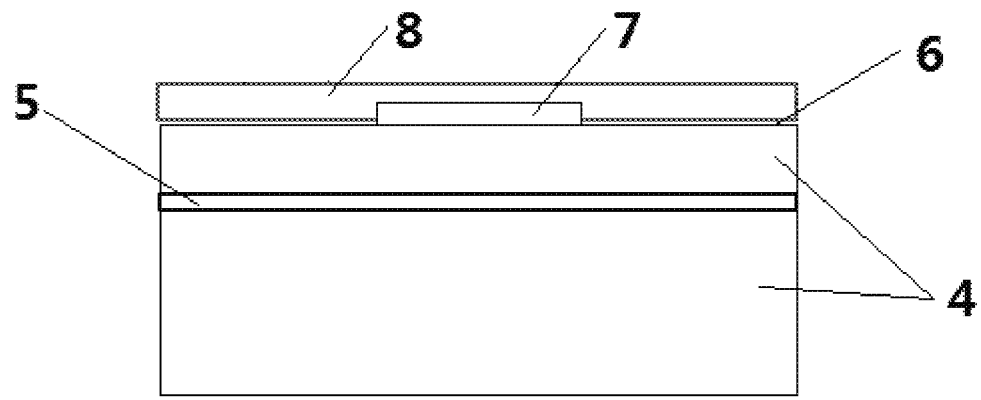
FIG. 2 is a structure diagram of growing a supporting layer on a piezoelectric single crystal wafer obtained in step (b) of the method for constructing a cavity type film bulk acoustic wave resonator without making a sacrificial layer in embodiment 1 of the invention.
Figure 3:
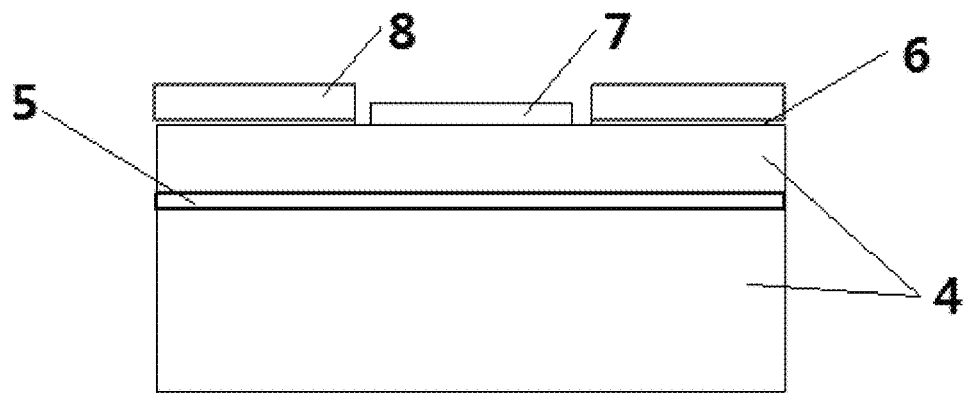
FIG. 3 is a structure diagram of a piezoelectric single crystal wafer with a cavity obtained in step (b) of the method for constructing a cavity type film bulk acoustic wave resonator without making a sacrificial layer in embodiment 1 of the invention.
Figure 4:
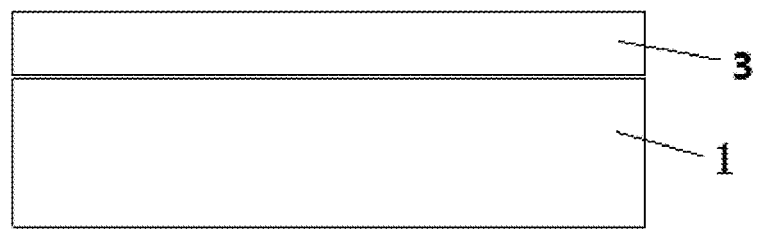
FIG. 4 is a structure diagram of the substrate coated with the bonding compound obtained in step (c) of the method for constructing a cavity type film bulk acoustic wave resonator without making a sacrificial layer in embodiment 1 of the invention.
Figure 5:
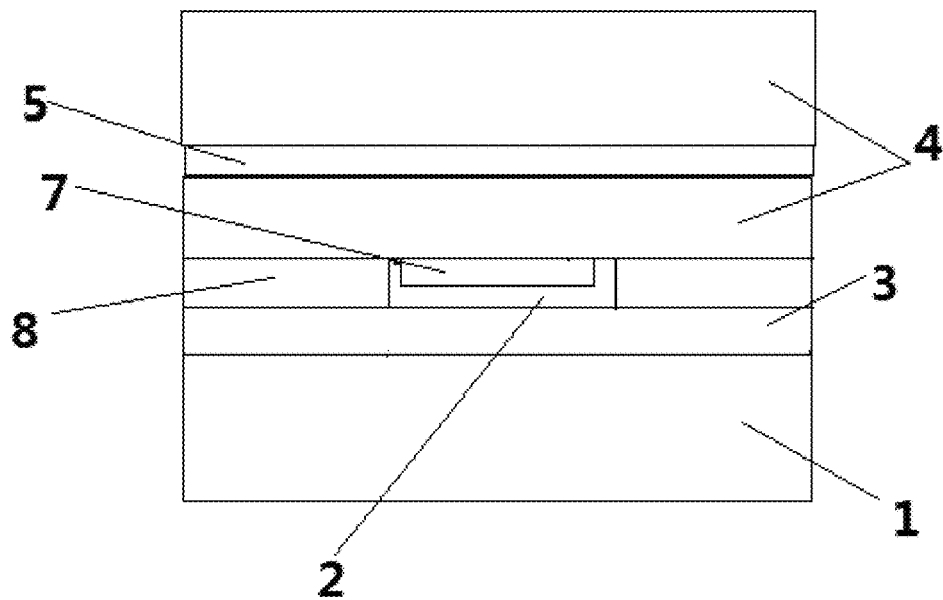
FIG. 5 is a structure diagram of the bonded intermediate obtained in step (c) of the method for constructing a cavity type film bulk acoustic wave resonator without making a sacrificial layer in embodiment 1 of the invention.
Figure 6:
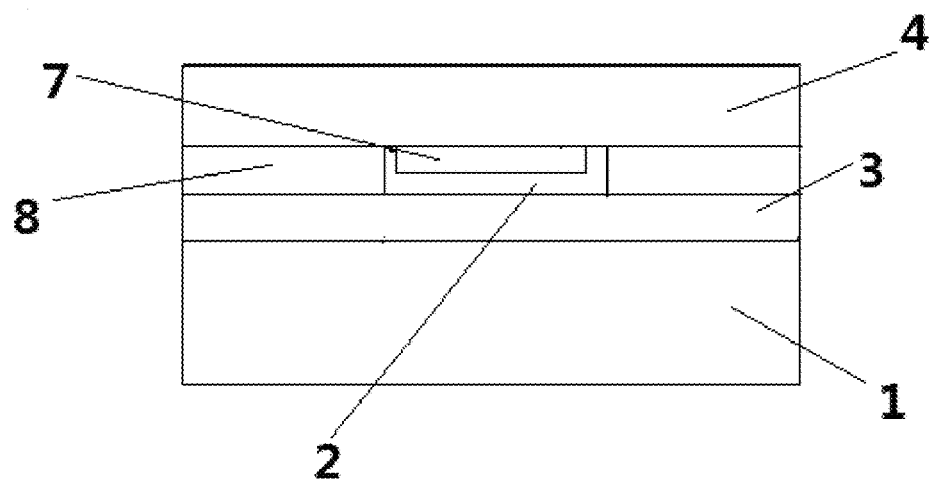
FIG. 6 is a structure diagram of the film peeling obtained in step (d) of the method for constructing a cavity type film bulk acoustic wave resonator without making a sacrificial layer in embodiment 1 of the invention.
Figure 7:
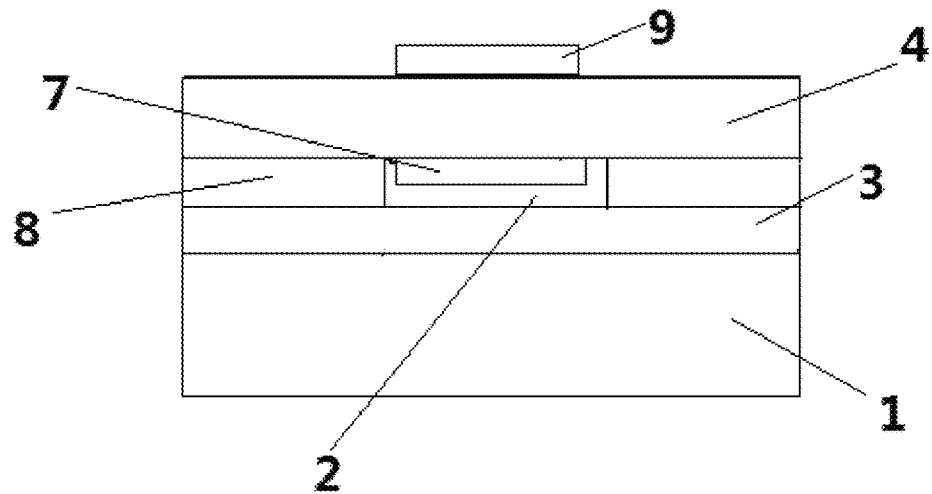
FIG. 7 is a structure diagram of the cavity type film bulk acoustic wave resonator without a sacrificial layer obtained in step (d) of the method for constructing a cavity type film bulk acoustic wave resonator without making a sacrificial layer in embodiment 1 of the invention.

The method for constructing a cavity type film bulk acoustic wave resonator without making a sacrificial layer of this embodiment comprises the following steps:

(a) a piezoelectric single crystal wafer is applied; the piezoelectric single crystal wafer is a lithium tantalate wafer; ion implantation is performed on the piezoelectric single crystal wafer to form an ion damage layer, and the implanted ions are H ions; the energy for the implanted ions is 195 KeV, the implantation dose is $6\times10^{16}/cm^2$, the ion beam current is 1 1 $\mu m/cm^{-2}$, and the implantation depth is 6 $\mu m$; as a result, the pyroelectric material is obtained. The implantation surface of the pyroelectric material is lithographically formed a pattern to be grown, and then the electrode is grown by magnetron sputtering; the electrode material is Au. Finally, the excess part is washed off with acetone to obtain an ion-implanted piezoelectric single crystal wafer with a bottom electrode. The thickness of the bottom electrode is 100 nm; as shown in FIG. 1, a structure diagram of an ion-implanted piezoelectric single crystal wafer with a bottom electrode obtained in step (a);

(b) using the piezoelectric single crystal wafer obtained in step (a), growing a supporting layer on the bottom electrode side of the piezoelectric single crystal wafer, and then performing pattern etching on one side of the growing supporting layer to etch the supporting layer to form a cavity; the supporting layer is one or more of silicon oxide, silicon nitride, amorphous silicon, and metal;

specifically, the supporting layer is grown on the piezoelectric single crystal wafer, and the supporting layer is $SiO_2$. FIG. 2 is a structure diagram of growing a supporting layer on a piezoelectric single crystal wafer obtained in step (b); then, the pattern to be etched is transferred on the supporting layer, and then a mask is prepared on the surface of the supporting layer, and the convex corners of the pattern of the mask are provided with convex corner compensation parts, and then wet etching is performed. During the etching process, the part covered by the mask is retained, and the part not covered by the mask is etched away to form a cavity; the wet etching can be adopted for anisotropic etching of single crystal silicon. When wet etching is used to etch single crystal silicon, the etching solution shows the fastest corrosion rate for the supporting layer under the convex corner structure in the mask pattern. Therefore, a convex corner compensation is set through the etching pattern design, and the "convex corner" can be compensated to avoid structural loss; as shown in FIG. 3, a structure diagram of a piezoelectric single crystal wafer with a cavity obtained in step (b);

as a preferred implementation of this embodiment, a supporting layer is grown on the piezoelectric single crystal wafer; the support layering is $SiO_2$. The pattern to be etched is transferred on the supporting layer, and the cleaning solution is used to clean the supporting layer, removing impurities from the surface, and then spin-coating photoresist on the surface of the supporting layer as a mask, and obtaining a pattern of the mask by photolithography. The convex corner of the pattern of the mask is provided with a convex corner compensation; then, the target location is etched by wet etching to form a cavity, and the depth of the cavity is 4,000 nm, and the location of the cavity is the cavity layer; after the target location is etched, the cleaning solution is used to remove impurities from the surface to obtain a piezoelectric single crystal wafer with a cavity;

as a preferred implementation of this embodiment, the cleaning solution is one or more of water, acetone, ethanol, and hydrogen fluoride; in this embodiment, acetone and ethanol solutions are used respectively to remove impurities from the surface, and then deionized water is used for rinsing, then immersion in 15 w % hydrogen fluoride is performed for 20 minutes to remove the oxide layer, and rinsing with deionized water repeatedly is conducted as the last step;

Wherein, the wet etching is specifically: etching with an etchant at a temperature of 90° C. for 30 minutes; the etchant is a KOH solution with a concentration of 30 w %;

(c) using a substrate of silicon, coating bonding compound onto one side of the substrate to form a bonding layer; the bonding layer is combined with the bottom electrode side of the piezoelectric single crystal wafer obtained in step (b) to form a bonded intermediate; as shown in FIG. 4, a structure diagram of the substrate applied with the bonding compound obtained in step (c). As shown in FIG. 5, a structure diagram of the bonded intermediate obtained in step (c);

wherein, as a preferred implementation of this embodiment: the bonding compound is benzocyclobutene and the thickness of the bond layer is 4 μm; the bonding compound is coated by spin coating; the spin coating includes a low speed phase and a high speed phase; the speed of the low speed phase is 800 rpm/s, and the rotation time is 10 s; the speed of the high speed phase is 3,000 rpm/s, and the rotation time is 30 s;

as a preferred implementation of this embodiment, the substrate spin-coated with the bonding compound is placed in an oven for pre-baking, the pre-baking temperature is 100° C., and the pre-baking time is 4 min;

as a preferred implementation of this embodiment, the bonding specifically includes the following steps: first, the piezoelectric single crystal wafer that has undergone ion implantation and has a bottom electrode and the substrate are placed in a bonding machine or a tube furnace for pre-bonding; the pre-bonding pressure is $4 \times 10^5$ pa, and the pressure holding time is 30 min; then, the temperature is slowly increased to 200° C., and the temperature is maintained at 200° C. for 2 hours to make the benzocyclobutene completely cured; the bonding is completed, and the bonded intermediate product is obtained;

(d) the bonded intermediate obtained in step (c) is annealed at a temperature of 350° C. for 2 hours to peel off the film. The off-peeled film can recover the lattice damage caused by ion implantation during the annealing process, thereby obtaining the off-peeled film; as shown in FIG. 6, a structure diagram of the film peeling obtained in step (d). Electron beam evaporation or magnetron sputtering is used to prepare a top electrode of patterned metal on the surface of the off-peeled film to obtain a cavity type bulk acoustic resonator without a sacrificial layer; wherein, the electrode material of the top electrode is Al, and the electrode thickness is 100 nm. FIG. 7 is a structure diagram of the cavity type film bulk acoustic wave resonator without making a sacrificial layer obtained in step (d) of the method for constructing a cavity type film bulk acoustic wave resonator without making a sacrificial layer in embodiment 1 of the invention;

as a preferred implementation of this embodiment, the step of bombarding the obtained peeling film is included: RIE plasma is used to bombard the obtained peeling film to reduce its roughness to 4 nm; in the RIE plasma bombarding step, the ion used is Ar+ ion, the pressure is 20 mT, the flow rate is 30 sccm, the RIE power is 100 W, the vacuum degree is $10^{-4}$ Pa, and the treatment time is 120 s.

The cavity type film bulk acoustic wave resonator constructed in this embodiment without making a sacrificial layer includes a top electrode, a piezoelectric film, a bottom electrode, a supporting layer, a bonding layer, and a substrate that are sequentially arranged from top to bottom. The supporting layer is provided with a cavity; the piezoelectric film is an off-peeled film. The upper surface area of the bottom electrode of the cavity type film bulk acoustic wave resonator constructed in this embodiment without making a sacrificial layer is smaller than the upper surface area of the cavity.

Embodiment 2

The method for constructing a cavity type film bulk acoustic wave resonator without making a sacrificial layer of this embodiment comprises the following steps:

(a) using a piezoelectric single crystal wafer; the piezoelectric single crystal wafer is a lithium tantalate wafer; ion implantation is performed on the piezoelectric single crystal wafer, and the implanted ions are As ions; the energy for the implanted ions is 150 KeV-1,000 KeV, and the implantation depth is 0.5-1.8 μm; as a result, the pyroelectric material is obtained. An electrode of Au is then grown by magnetron sputtering on the implantation surface of the obtained pyroelectric material. Then, the mask is prepared. Finally, the excess part is washed off to obtain an ion-implanted piezoelectric single crystal wafer with a bottom electrode. The thickness of the bottom electrode is 100 nm;

(b) using an ion-implanted piezoelectric single crystal wafer with a bottom electrode, and form a cavity on the bottom electrode side of the piezoelectric single crystal wafer with a supporting layer around the cavity, using a substrate; growing bonding compound on one side of the substrate, and bonding the substrate to the cavity side of the piezoelectric single crystal wafer; wherein, the bonding compound is one or more of silicon oxide, silicon nitride, aluminum oxide, and aluminum nitride; in this embodiment, the bonding compound is silicon dioxide;

as a preferred implementation of this embodiment, the bonding specifically includes the following steps: first, the piezoelectric single crystal wafer that has undergone ion implantation and has a bottom electrode and the substrate are placed in a bonding machine or a tube furnace for pre-bonding; the pre-bonding pressure is $4\times10^5$ pa, and the pressure holding time is 30 min; then, the temperature is slowly increased to 200° C., and the temperature is maintained at 200° C. for 2 hours to ensure complete curing; the bonding is completed, and the bonded intermediate product is obtained;

(c) the bonded intermediate obtained in step (b) is annealed at a temperature of 350° C. for 2 hours to peel off the film. The off-peeled film can recover the lattice damage caused by ion implantation during the annealing process, thereby obtaining the off-peeled film. Electron beam evaporation or magnetron sputtering is used to prepare a top electrode of patterned metal on the surface of the off-peeled film; wherein, the electrode material of the top electrode is Al, and the electrode thickness is 100 nm.

The cavity type film bulk acoustic wave resonator without making a sacrificial layer obtained in this embodiment comprises a top electrode, a piezoelectric film, a bottom electrode, a supporting layer, a bonding layer and a substrate that are sequentially arranged from top to bottom, and the supporting layer is provided with a cavity; wherein, the bonding layer has a thickness of 2-6 μm. The piezoelectric film is the off-peeled film.

Embodiment 3

The method for constructing a cavity type film bulk acoustic wave resonator without making a sacrificial layer in this embodiment is exactly the same as the method in embodiment 1, except that the upper surface area of the bottom electrode is greater than the upper surface area of the cavity.

Figure 8:
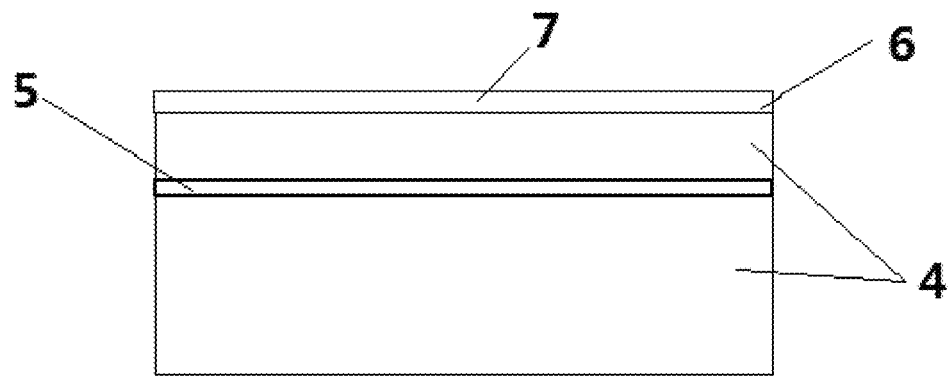
FIG. 8 is a structure diagram of an ion-implanted piezoelectric single crystal wafer with a bottom electrode obtained in step (b) of the method for constructing a cavity type film bulk acoustic wave resonator without making a sacrificial layer in embodiment 3 of the invention.

As shown in FIG. 8, a structure diagram of an ion-implanted piezoelectric single crystal wafer with a bottom electrode obtained in step (b).

Figure 9:
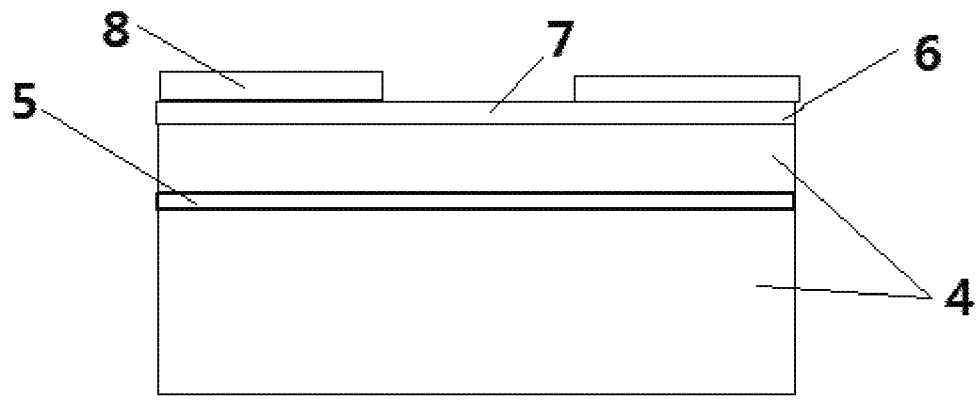
FIG. 9 is a diagram of the structure of growing a supporting layer on the piezoelectric single crystal wafer obtained in step (c) of the method for constructing a cavity type film bulk acoustic wave resonator without making a sacrificial layer in embodiment 3 of the invention.

FIG. 9 is a structure diagram of the structure of growing a supporting layer on the piezoelectric single crystal wafer obtained in step (c) of the method for constructing a cavity type film bulk acoustic wave resonator without making a sacrificial layer in embodiment 3 of the invention.

Figure 10:
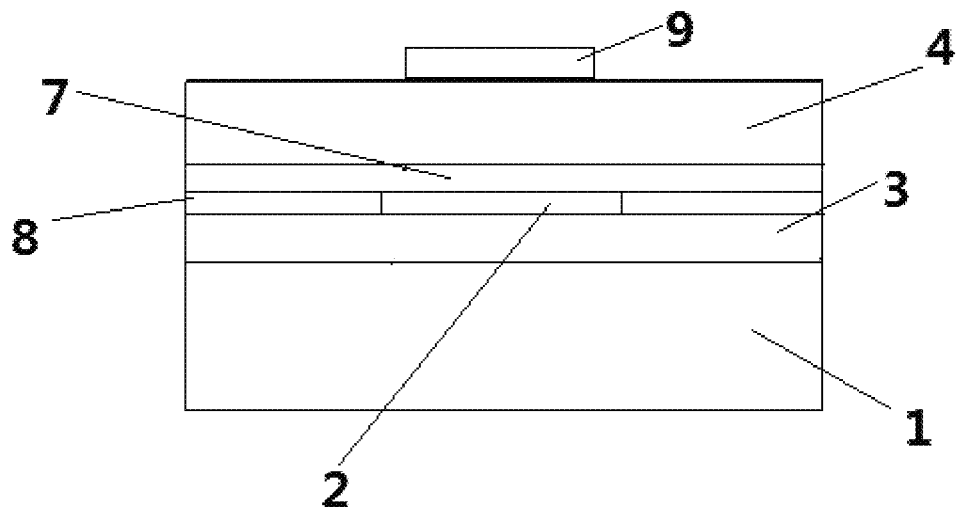
FIG. 10 is a structure diagram of the cavity type film bulk acoustic wave resonator without making a sacrificial layer obtained in step (d) of the method for constructing a cavity type film bulk acoustic wave resonator without making a sacrificial layer in embodiment 3 of the invention.

FIG. 10 is a structure diagram of the cavity type film bulk acoustic wave resonator without making a sacrificial layer obtained in step (d) of the method for constructing a cavity type film bulk acoustic wave resonator without making a sacrificial layer in embodiment 3 of the invention.

Embodiment 4

The method for constructing a cavity type film bulk acoustic wave resonator without making a sacrificial layer of this embodiment comprises the following steps:

(1) using an ion-implanted piezoelectric single crystal wafer with a bottom electrode, and forming a cavity on the side of the piezoelectric single crystal wafer having a bottom electrode; using a substrate and coating bonding compound onto one side of the substrate, bonding the substrate to the cavity side of the piezoelectric single crystal wafer; wherein, the bonding compound is an organic insulating material which includes at least one of benzocyclobutene and polyimide; preferably, the thickness of the coated bonding compound is 100 nm-4,000 nm; in this embodiment, the organic insulating material is polyimide amine, the thickness of the coated bonding compound is 2,000 nm;

(2) performing heat treatment on the bonded intermediate obtained in step (1), peeling off the film from the piezoelectric single crystal wafer and generating top electrode at the film-peeling side.

Embodiment 5

The method for constructing a cavity type film bulk acoustic wave resonator without making a sacrificial layer of this embodiment comprises the following steps:

(1) using an ion-implanted piezoelectric single crystal wafer with a bottom electrode, and forming a cavity on the bottom electrode side of the piezoelectric single crystal wafer, using a substrate; growing bonding compound on one side of the substrate, and bonding the substrate to the cavity side of the piezoelectric single crystal wafer; wherein, the bonding compound is one or more of silicon oxide, silicon nitride, aluminum oxide, and aluminum nitride; in this embodiment, the bonding compound is aluminum oxide;

(2) performing heat treatment on the bonded intermediate formed in step (1), peeling off the film from the piezoelectric single crystal wafer and generating top electrode at the film-peeling side.

Comparative Example

The method for constructing a cavity type film bulk acoustic wave resonator without making a sacrificial layer in the comparative example is of the same conditions and practice as in embodiment 1, except that a substrate with a cavity is replaced by a substrate with a sacrificial layer, comprising the following steps:

using a substrate and growing a sacrificial layer of amorphous silicon thereon, using an ion-implanted piezoelectric single crystal wafer with a bottom electrode, growing a bonding compound on the bottom electrode side to bond with the substrate, and then performing peeling to obtain a piezoelectric film, after that etching an opening in the upper surface of the piezoelectric single crystal wafer, introducing $XeF_2$ gas through the etched hole to etch the amorphous silicon sacrificial layer, after forming a cavity, a cavity type film bulk acoustic wave resonator without making a sacrificial layer is obtained.

Effect Test Example

To verify the technical effect of the method for constructing a single crystal film device with a cavity structure described in the invention, the single crystal film is formed with the methods in embodiments 1-5 and the comparative example, respectively, and the following comparative detection tests are performed.

100 single crystal films are formed according to the methods in embodiments 1-5 and the comparative example, which are inspected and recorded, using the single crystal films formed according to the methods in embodiments 1-5 and the comparative example and measuring their Q value, and recording the results, using the single crystal films formed according to the methods in embodiments 1-5 and the comparative example respectively to construct film bulk acoustic wave resonators, then measuring their clutter number and recording the results.

The data obtained from the above tests are as follows:

| Group | Yield | Q value | Clutter number |
|---|---|---|---|
| Embodiment 1 | 98% | 2,500 | None |
| Embodiment 2 | 99% | 3,000 | None |
| Embodiment 3 | 98% | 2,800 | None |
| Embodiment 4 | 98% | 1,500 | None |
| Embodiment 5 | 99% | 2,000 | A few |
| Comparative example | 76% | 300 | Many |

It can be seen from the above test results that the single crystal film device with a cavity structure constructed by the method of the invention has improved its mechanical strength, and the film thereof is not easy damaged by etching, and the quality of the film is not affected; The cavity structure formed before the film has high yield and no residue left from etching after the film formation, with high-quality single crystal oxide film grown on a polycrystalline metal bottom electrode to construct a single crystal film device with the film peeing method. Besides, in embodiment 2, the Q value of the single crystal film obtained by bonding using silicon dioxide as the bonding compound is superior to the Q value of the single crystal film obtained by bonding using benzocyclobutene as the bonding compound in embodiment 1.

Common technical knowledge shows that the invention can be realized through other implementations remaining pertinent to its spirit or necessary features. As a result, the above-disclosed embodiments are merely illustrative in all aspects, and not the only ones. All changes within the scope of the invention or within the scope equivalent to the invention are encompassed by the invention.

The invention claimed is:

1. A method for constructing a cavity-type film bulk acoustic wave resonator without making a sacrificial layer, said method comprising the following steps:

(1) using an ion-implanted piezoelectric single crystal wafer with a bottom electrode, and forming a cavity on a bottom electrode side of the piezoelectric single crystal wafer; using a substrate and providing a bonded intermediate by bonding the substrate to a cavity side of the piezoelectric single crystal wafer by step (a):

(a) applying a bonding compound to one side of the substrate and bonding the substrate to the cavity side of the piezoelectric single crystal wafer; wherein the bonding compound is at least one organic insulating material selected from the group consisting of benzocyclobutene, polyimide, silsesquioxane and spin-on glass, wherein the bonding compound is applied by spin coating to form a bonding layer; the spin coating includes a low rotation speed phase and a high rotation speed phase; the low rotation speed phase having a rotation speed of 200 rpm/s-800 rpm/s and a rotation time of 10 s-30 s; and the high rotation speed phase having a rotation speed of 1,000 rpm/s-8,000 rpm/s, and a rotation time of 15 s-60 s; and (2) performing heat treatment on the bonded intermediate obtained in step 1, peeling off a film from the piezoelectric single crystal wafer and generating a top electrode at a film-peeling side.

2. The method according to claim 1, wherein:

the piezoelectric single crystal wafer is of one of the following: quartz, lithium niobate, lithium tantalate, aluminum nitride, zinc oxide, barium titanate, potassium dihydrogen phosphate and lead magnesium niobate;

an ion-implanted piezoelectric single crystal wafer with a bottom electrode is obtained according to the following procedure: taking a piezoelectric single crystal wafer, implanting ions onto the piezoelectric single crystal wafer and growing a bottom electrode on an implanted face thereof to form an ion-implanted piezoelectric single crystal wafer with a bottom electrode.

3. The method according to claim 2, wherein:

the ions implanted into the piezoelectric single crystal wafer are at least one member selected from the group consisting of hydrions, helium ions, boron ions, and arsenic ions, the energy of ion implantation is 100 KeV-1,000 KeV; the implantation dose is $2\text{-}8\times10^{16}/cm^2$;

and the implantation depth is 0.3-8 μm.

4. The method according to claim 3, wherein:

the bottom electrode of the piezoelectric single crystal wafer is grown by the following procedures: (a) first lithographically forming a pattern to be grown on the surface of the piezoelectric single crystal wafer, then growing the electrode, and finally washing off an excess part; or (b) first, growing electrode on the surface of the piezoelectric single crystal wafer, then preparing a mask, and finally etching away the excess part;

an electrode material of the growing bottom electrode is one of Al, Au, Mo, Pt, and W;

the thickness of the bottom electrode is 50-500 nm; and the bottom electrode is grown by a process selected from the group consisting of magnetron sputtering, resistive evaporation, and electron beam deposition.

5. The method according to claim 4, wherein the material of the substrate is one or more of silicon, silicon on an insulating layer, glass, quartz, lithium niobate, lithium tantalate, silicon carbide, gallium nitride, and gallium arsenide.

6. The method according to claim 2, wherein the ions implanted into the piezoelectric single crystal wafer are at least one member selected from the group consisting of $H^+$, $He^+$, $B^+$ and $As^+$, the energy of ion implantation is 100 KeV-1,000 KeV; the implantation dose is $2\text{-}8\times10^{16}/cm^2$; and the implantation depth is 0.3-8 μm.

7. The method according to claim 1, wherein in step (1), forming a cavity on the bottom electrode side of the piezoelectric single crystal wafer includes the following steps: growing a support layer on the bottom electrode side of the piezoelectric single crystal wafer, and forming a cavity on a grown film.

8. The method according to claim 7, wherein forming a cavity on the bottom electrode side of the piezoelectric single crystal wafer includes the following steps: taking the piezoelectric single crystal wafer, growing a supporting layer on the bottom electrode side of the piezoelectric single crystal wafer, and then performing pattern etching on the side of the growing supporting layer to etch the supporting layer to form a cavity; and the supporting layer is one or more of silicon oxide, silicon nitride, amorphous silicon, and metal.

9. The method according to claim 8, wherein an electrode protection layer is also grown between the supporting layer and the bottom electrode; the electrode protection layer includes one or more of silicon oxide, silicon nitride, amorphous silicon, aluminum oxide, and aluminum nitride; and dry etching or wet etching is adopted for the etching of the growing supporting layer.

10. The method according to claim 7, wherein a cavity depth of the cavity is greater than 100 nm.

11. The method according to claim 1, wherein in step (2), the film of the bonded intermediate obtained in step (1) is peeled off at a temperature of 180-400° C., and then annealed at a temperature of 180-400° C. for 10 to 600 minutes to obtain an off-peeled film.

12. The method according to claim 11, wherein the thickness of the piezoelectric single crystal wafer with the film peeled off is 500-1,000 nm; the electrode material of the growing-top electrode is one of Al, Au, Mo, Pt, and W; and the thickness of the top electrode is 50-300 nm.

13. The method according to claim 1, wherein the applied bonding compound is 100 nm to 4,000 nm in thickness.

14. The method according to claim 1, wherein a step of pre-baking the piezoelectric single crystal wafer spin-coated with the bonding compound is included; the pre-baking temperature is 50-120° C., and the pre-baking time is 60-600 s; and in step (1), the substrate is pre-bonded with the cavity side of the piezoelectric single crystal wafer, and then the bonding is performed; the pre-bonded pressure is $1\times10^5$ Pa-$5\times10^6$ Pa, and the pressure holding time is 3-30 min; after pre-bonding, slowly increasing the temperature to 150-500° C., and keeping the temperature at 150-500° C. to make an organic polymer layer completely cured and the bonding is completed.

* * * * *